(12) United States Patent
Shiraki et al.

(10) Patent No.: US 11,757,409 B2
(45) Date of Patent: Sep. 12, 2023

(54) OSCILLATOR

(71) Applicant: SEIKO EPSON CORPORATION, Tokyo (JP)

(72) Inventors: Manabu Shiraki, Ina (JP); Shinya Aoki, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 18/070,999

(22) Filed: Nov. 29, 2022

(65) Prior Publication Data

US 2023/0170847 A1    Jun. 1, 2023

(51) Int. Cl.
| | |
|---|---|
| *H03B 5/32* | (2006.01) |
| *H03H 9/05* | (2006.01) |
| *H03H 9/10* | (2006.01) |

(52) U.S. Cl.
CPC ............ *H03B 5/32* (2013.01); *H03H 9/0552* (2013.01); *H03H 9/1014* (2013.01)

(58) Field of Classification Search
CPC ....... H03B 5/32; H03H 9/0552; H03H 9/1014
See application file for complete search history.

(56) References Cited

U.S. PATENT DOCUMENTS

| | | | |
|---|---|---|---|
| 10,224,904 B2 * | 3/2019 | Fukuzawa | H03B 5/368 |
| 2018/0274922 A1 * | 9/2018 | Nishizawa | G01C 19/5663 |
| 2020/0044623 A1 * | 2/2020 | Kojo | H03H 9/0547 |

FOREIGN PATENT DOCUMENTS

JP    2014-011663 A    1/2014

\* cited by examiner

*Primary Examiner* — Jeffrey M Shin
(74) *Attorney, Agent, or Firm* — Harness, Dickey & Pierce, P.L.C.

(57) ABSTRACT

An oscillator includes: a resonator element; a circuit element; and a container including a substrate mounted with the circuit element, in which the circuit element includes a first coupling terminal coupled to the resonator element, a second coupling terminal coupled to the resonator element and aligned in a first direction with the first coupling terminal in the first direction, and an output terminal disposed adjacent to the first coupling terminal in a second direction orthogonal to the first direction, in the second direction orthogonal to the first direction, and in which the substrate includes a first surface mounted with the circuit element and a second surface, and the substrate includes a first coupling electrode provided on the first surface and coupled to the first coupling terminal, a second coupling electrode coupled to the second coupling terminal, an output electrode coupled to the output terminal, a first coupling wiring provided on the second surface and coupled to the first coupling electrode, a second coupling wiring coupled to the second coupling electrode, an output wiring coupled to the output electrode, and a shield wiring that is provided between the first coupling wiring and the output wiring and to which a direct-current potential is applied.

7 Claims, 12 Drawing Sheets

FIG. 2
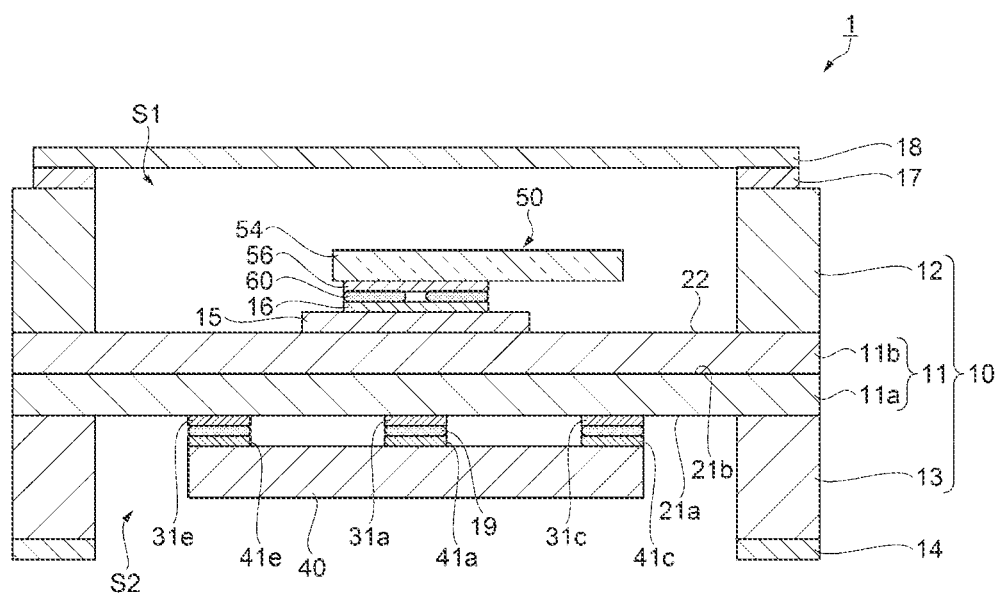
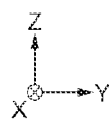

FIG. 4
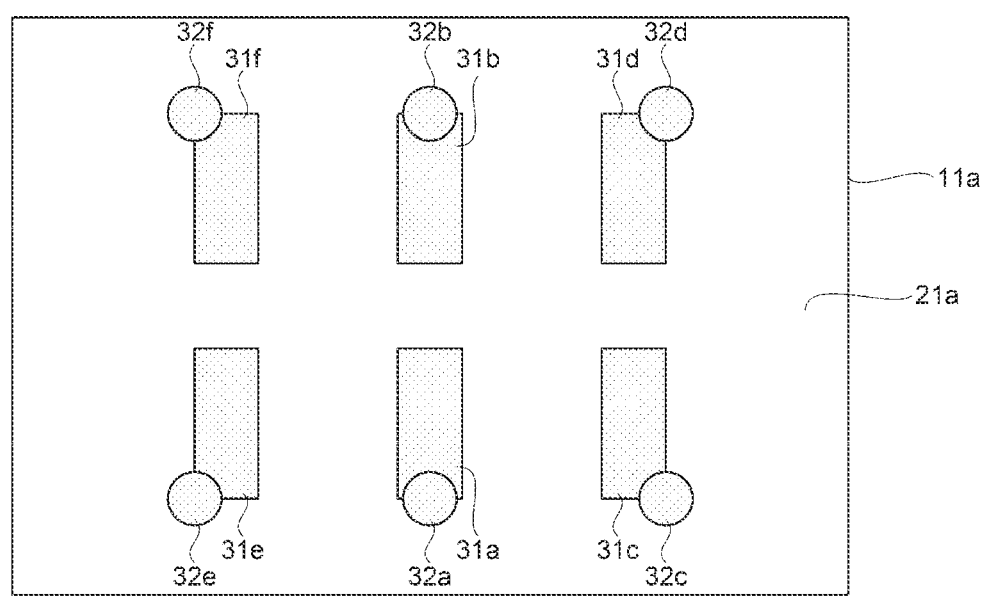
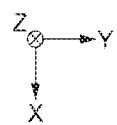

OSCILLATOR

The present application is based on, and claims priority from JP Application Serial Number 2021-194020, filed Nov. 30, 2021, the disclosure of which is hereby incorporated by reference herein in its entirety.

BACKGROUND

1. Technical Field

The present disclosure relates to an oscillator.

2. Related Art

In the related art, a piezoelectric device such as an oscillator includes a substrate mounted with an element, and an integrated circuit element and a piezoelectric element mounted on the substrate. For example, JP-A-2014-11663 discloses a piezoelectric device in which a mount pad provided on a lower surface of a substrate is mounted with an integrated circuit element, and a ground wiring pattern is provided to surround a piezoelectric element measurement pattern drawn out from the mount pad from three directions in order to reduce a capacitance generated between the piezoelectric element measurement pattern and an output wiring pattern.

However, in the piezoelectric device disclosed in JP-A-2014-11663, it is necessary to route the ground wiring pattern to surround the piezoelectric element measurement pattern coupled to the piezoelectric element on the lower surface of the substrate, and an interval between the piezoelectric element measurement pattern and the ground wiring pattern is narrow, and therefore a degree of freedom in wiring routing may be reduced.

SUMMARY

An oscillator includes: a resonator element; a circuit element that is coupled to the resonator element and is configured to output a clock signal; and a container that houses the resonator element and the circuit element and includes a substrate mounted with the circuit element, in which the circuit element includes a plurality of terminals including a first coupling terminal coupled to the resonator element, a second coupling terminal coupled to the resonator element and disposed side by side with the first coupling terminal in a first direction, and an output terminal that is disposed adjacent to the first coupling terminal in a second direction orthogonal to the first direction and from which the clock signal is output, in which the substrate includes a first layer including a first surface mounted with the circuit element and a second surface in a front and back relationship with the first surface, a second layer stacked on the first layer, a first coupling electrode provided on the first surface and coupled to the first coupling terminal, a second coupling electrode provided on the first surface and coupled to the second coupling terminal, an output electrode provided on the first surface and coupled to the output terminal, a first coupling wiring provided on the second surface and coupled to the first coupling electrode, a second coupling wiring provided on the second surface and coupled to the second coupling electrode, an output wiring provided on the second surface and coupled to the output electrode, and a shield wiring that is provided between the first coupling wiring and the output wiring on the second surface and to which a direct-current potential is applied.

BRIEF DESCRIPTION OF THE DRAWINGS

FIG. 2 is a cross-sectional view taken along a line A-A in FIG. 1.

FIG. 4 is a plan view showing an electrode pattern formed at a first surface of a first layer.

DESCRIPTION OF EXEMPLARY EMBODIMENTS

1. First Embodiment

First, an oscillator 1 according to a first embodiment will be described with reference to FIGS. 1 to 6 by taking an oscillator including a tuning fork type resonator element 50 as an example.

Figure 1:
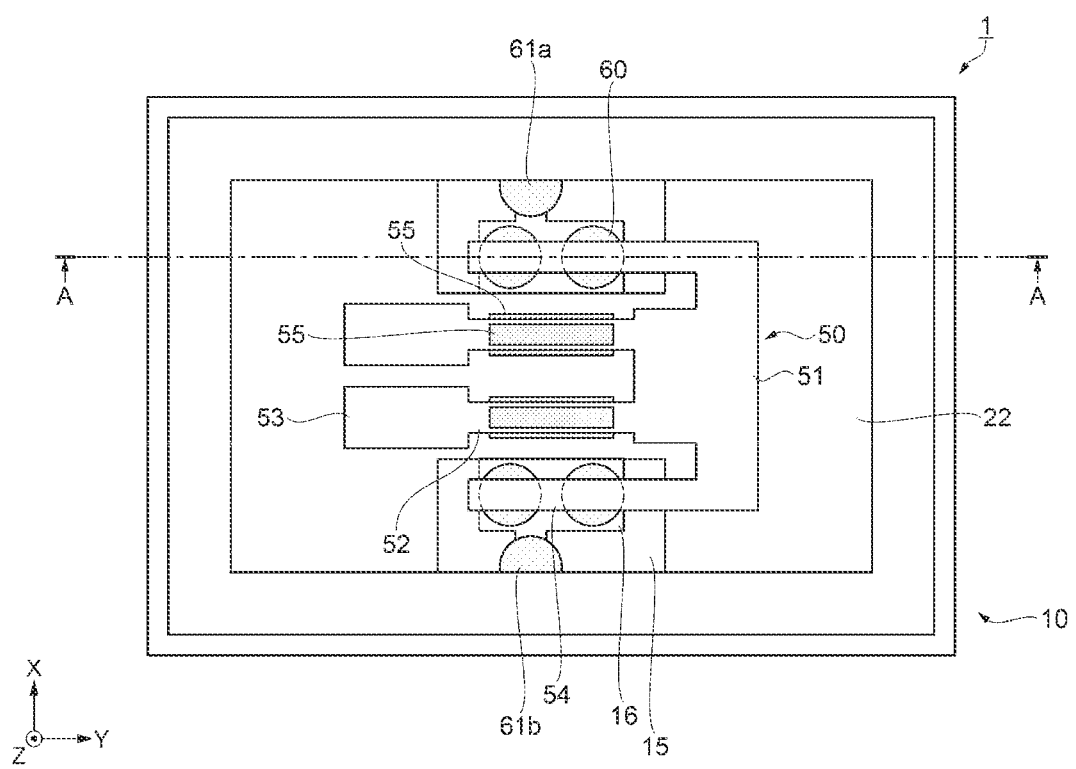
FIG. 1 is a plan view showing a schematic structure of an oscillator according to a first embodiment.

In FIG. 1, for convenience of description of an internal configuration of the oscillator 1, a state where a lid 18 is removed is shown. Further, in FIG. 2, illustration of wiring that electrically couples a mounting terminal 14 provided in a container 10 to electrodes 31c, 31d, 31e, and 31f provided on a first surface 21a of a first layer 11a and wiring that electrically couples excitation electrodes 55 to coupling electrodes 56 is omitted.

For convenience of description, in the following drawings, an X axis, a Y axis, and a Z axis are shown as three axes orthogonal to one another. Further, a direction along the X axis is referred to as an "X direction", a direction along the Y axis is referred to as a "Y direction", and a direction along the Z axis is referred to as a "Z direction". In the present specification, a first direction is the X direction, and a second direction is the Y direction. Further, an arrow tip end side in each axial direction is also referred to as a "plus side", a proximal end side in each axial direction is also referred to as a "minus side", a plus side in the Z direction is also referred to as "upper", and a minus side in the Z direction is also referred to as "lower".

As shown in FIGS. 1 and 2, the oscillator 1 according to the present embodiment includes a circuit element 40, the resonator element 50, the container 10 that houses the circuit element 40 and the resonator element 50, and the lid 18 that hermetically seals a housing space S1 in which the resonator element 50 is housed.

The circuit element 40 includes an oscillation circuit that oscillates the resonator element 50, and outputs a clock signal based on an oscillation frequency of the resonator element 50.

Figure 3:
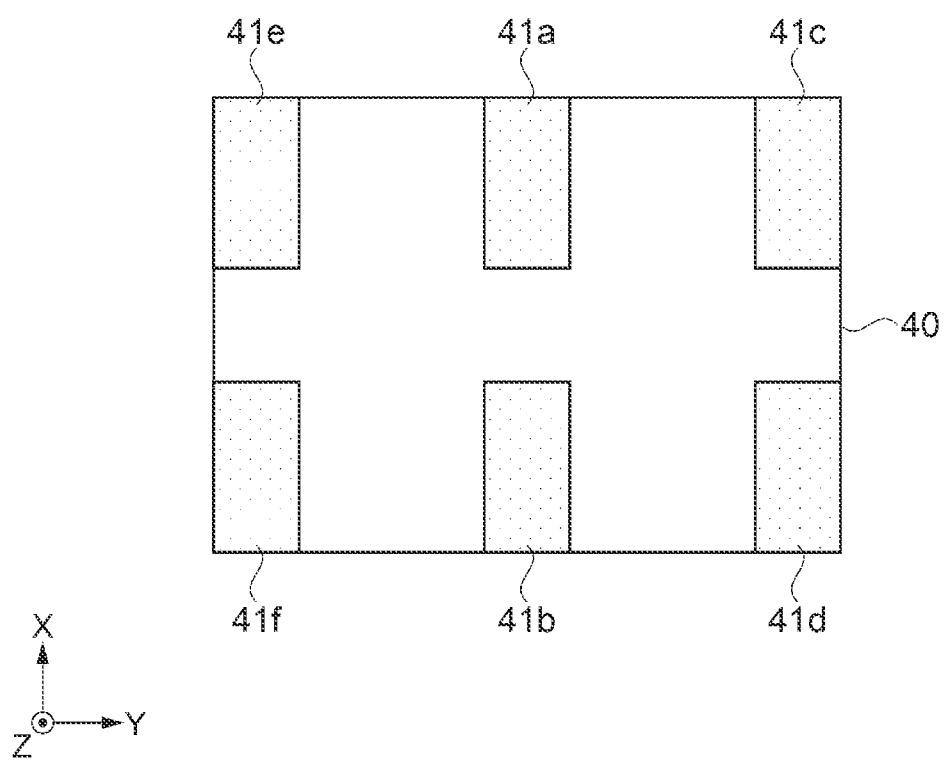
FIG. 3 is a plan view showing a terminal pattern formed at a circuit element.

As shown in FIG. 3, the circuit element 40 includes a first coupling terminal 41a coupled to the resonator element 50, a second coupling terminal 41b coupled to the resonator element 50 and disposed side by side with the first coupling terminal 41a in the X direction that is the first direction, an output terminal 41c that is disposed adjacent to the first coupling terminal 41a in the Y direction that is the second direction orthogonal to the first direction and from which a clock signal is output, a ground terminal 41d disposed adjacent to the second coupling terminal 41b in the Y direction, a power supply terminal 41e disposed adjacent to the first coupling terminal 41a on a side opposite to an output terminal 41c side, a control terminal 41f disposed adjacent to the second coupling terminal 41b on a side opposite to a ground terminal 41d side.

The resonator element 50 is a tuning fork type resonator element, is oscillated at a resonance frequency due to an outer shape and an outer dimension, and outputs a desired oscillation frequency.

The resonator element 50 uses a piezoelectric material such as quartz crystal as a base material, and as shown in FIG. 1, includes a base portion 51, a pair of vibrating arms 52 that extend from the base portion 51 in a minus Y direction, weight portions 53 coupled to tip end portions of the vibrating arms 52 in the minus Y direction, support arms 54 that extend from the base portion 51 in the minus Y direction and are provided in parallel with the vibrating arms 52, the excitation electrodes 55 each formed at the vibrating arm 52 and made of gold or the like, and the coupling electrode 56 formed at the support arm 54 and made of gold or the like.

The container 10 is made of ceramic or the like, and is configured by stacking a substrate 11 on which the flat plate-shaped circuit element 40 is mounted, an annular first frame substrate 12 from which a central portion is removed, and an annular second frame substrate 13 from which a central portion is removed, which is disposed on a side opposite to the first frame substrate 12 and sandwiches the substrate 11.

The substrate 11 includes the first layer 11a having a first surface 21a on which the circuit element 40 is mounted and a second surface 21b in a front and back relationship with the first surface 21a, and a second layer 11b stacked on the first layer 11a. The resonator element 50 is mounted on a second surface 21b side that is one side of the substrate 11, and the circuit element 40 is mounted on a first surface 21a side that is the other side of the substrate 11.

As shown in FIG. 4, a first coupling electrode 31a coupled to the first coupling terminal 41a, a second coupling electrode 31b coupled to the second coupling terminal 41b, and an output electrode 31c coupled to the output terminal 41c are provided on the first surface 21a of the first layer 11a. Further, a ground electrode 31d coupled to the ground terminal 41d, a power supply electrode 31e coupled to the power supply terminal 41e, and a control electrode 31f coupled to the control terminal 41f are provided.

The circuit element 40 is mounted on the first surface 21a of the housing space S2 formed with the substrate 11 and the second frame substrate 13. As shown in FIG. 2, the electrodes 31a, 31b, 31c, 31d, 31e, and 31f on the first surface 21a and the terminals 41a, 41b, 41c, 41d, 41e, and 41f provided on the circuit element 40 are electrically and mechanically coupled to each other via a conductive adhesive or a bonding member 19 such as a gold bump.

Figure 5:
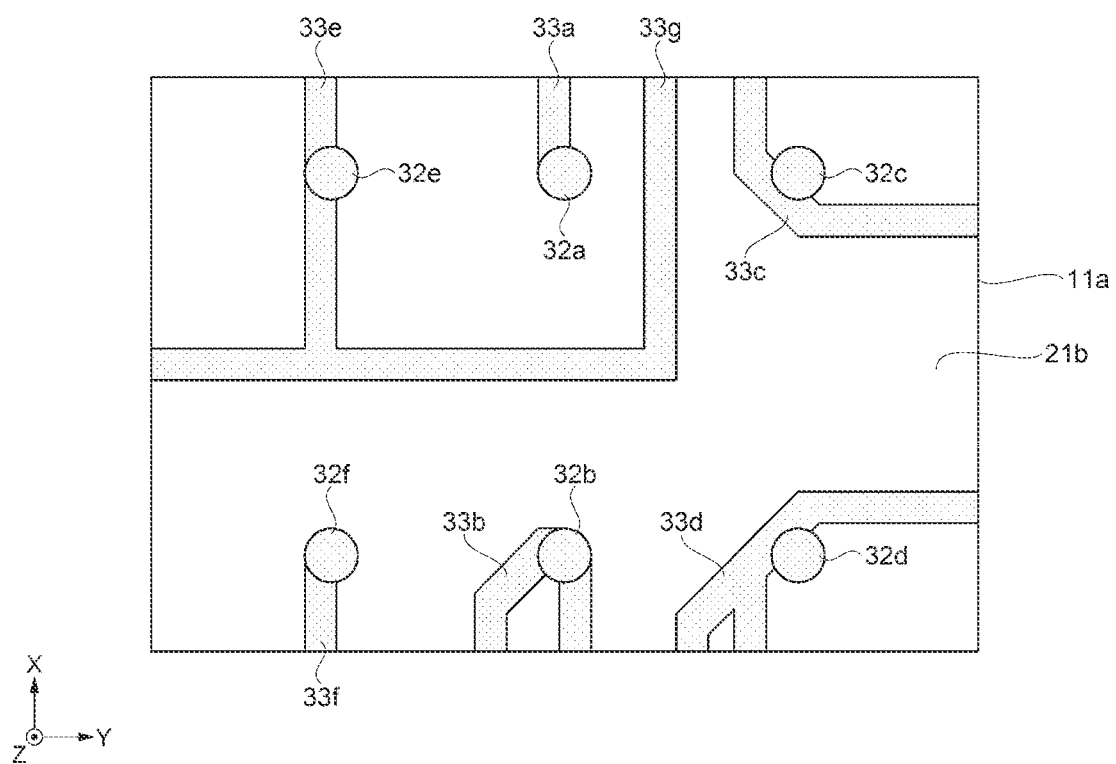
FIG. 5 is a plan view showing a wiring pattern formed at a second surface of the first layer.

As shown in FIG. 5, a first coupling wiring 33a coupled to the first coupling electrode 31a via a through electrode 32a, a second coupling wiring 33b coupled to the second coupling electrode 31b via a through electrode 32b, and an output wiring 33c coupled to the output electrode 31c via a through electrode 32c are provided on the second surface 21b of the first layer 11a. Further, a ground wiring 33d coupled to the ground electrode 31d via a through electrode 32d, a power supply wiring 33e coupled to the power supply electrode 31e via a through electrode 32e, and a control wiring 33f coupled to the control electrode 31f via a through electrode 32f are provided. Further, in a plan view, a shield wiring 33g that is coupled to the power supply wiring 33e and to which a direct-current potential is applied is provided between the first coupling wiring 33a and the output wiring 33c. Further, the shield wiring 33g is provided to extend in the Y direction between the first coupling wiring 33a and the second coupling wiring 33b.

Since the shield wiring 33g having a simple wiring pattern with a high degree of freedom in wiring routing is coupled to the power supply wiring 33e, and the shield wiring 33g is provided between the first coupling wiring 33a and the output wiring 33c, a parasitic capacitance generated between the first coupling wiring 33a and the output wiring 33c can be reduced, and a difference in the parasitic capacitance generated between the second coupling wiring 33b and the output wiring 33c can be reduced, so that deterioration in output signal characteristics can be reduced.

Figure 6:
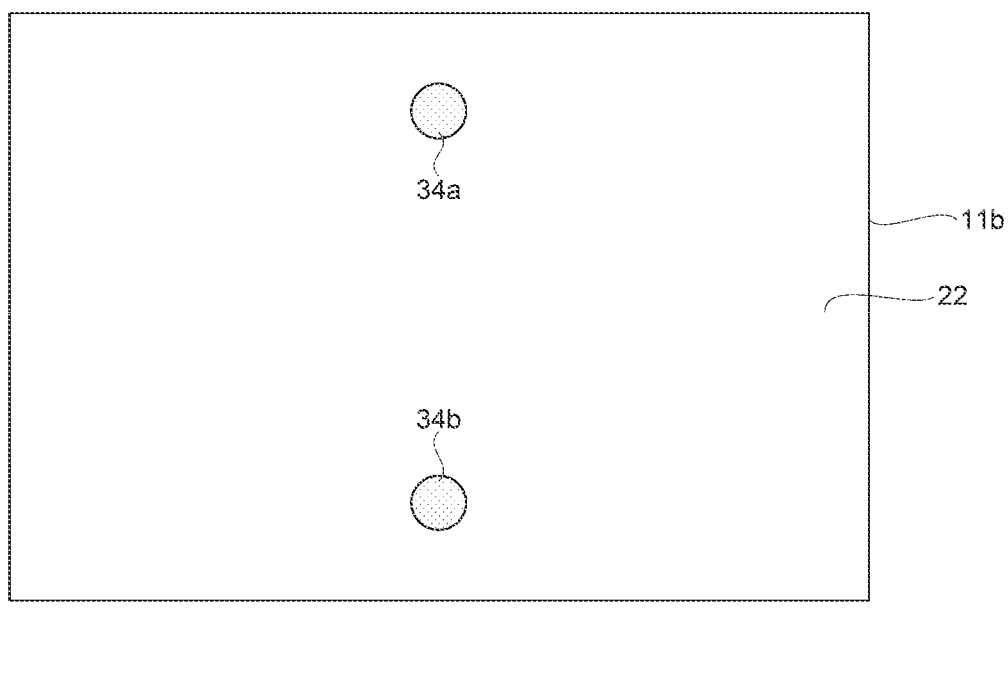
FIG. 6 is a plan view showing an electrode pattern formed at an upper surface of the second layer.

As shown in FIG. 6, in a plan view, in the second layer 11b, through electrodes 34a and 34b are respectively provided at positions overlapping the through electrodes 32a and 32b of the first layer 11a, and the through electrodes 34a and 34b are respectively electrically coupled to the through electrodes 32a and 32b provided in the first layer 11a.

As shown in FIGS. 1 and 2, two mount portions 15 for fixing the resonator element 50 are stacked and disposed on an upper surface 22 of the second layer 11b.

In a plan view, the mount portions 15 are provided with through electrodes 61a and 61b at positions overlapping the through electrodes 34a and 34b of the second layer 11b. The through electrode 61a is electrically coupled to a mount electrode 16 provided on the mount portion 15 disposed on the plus side in the X direction, and the through electrode 61b is electrically coupled to a mount electrode 16 provided on the mount portion 15 disposed on the minus side in the X direction. Therefore, the mount electrodes 16 are electrically coupled to the first coupling terminal 41a and the second coupling terminal 41b provided on the circuit element 40.

The support arm 54 of the resonator element 50 is disposed on the mount portion 15. The support arm 54 is coupled and fixed to the mount portion 15 provided on the substrate 11 at a position between both end portions of the vibrating arm 52 in the Y direction. More specifically, the coupling electrode 56 formed at the support arm 54 and the mount electrode 16 formed at the mount portion 15 are electrically and mechanically coupled to each other via a bonding member 60 such as a gold bump.

The lid 18 is made of metal, ceramics, glass, or the like, and is bonded to the container 10 via a bonding member 17 such as a seal ring or low-melting-point glass, so that the hermetically sealed housing space S1 that houses the resonator element 50 can be formed. Further, the housing space S1 is a hermetic space, and is in a depressurized state, preferably in a state closer to a vacuum.

In the oscillator 1 of the present embodiment, since the substrate 11 has a two-layer structure, the mount electrode 16 is disposed on a second layer 11b side, and an interval between the first coupling wiring 33a electrically coupled to the mount electrode 16 and the output wiring 33c can be increased, so that the shield wiring 33g having the simple wiring pattern with the high degree of freedom in the wiring routing can be provided between the first coupling wiring 33a and the output wiring 33c. Therefore, the parasitic capacitance generated between the first coupling wiring 33a and the output wiring 33c can be reduced, and the difference with respect to the parasitic capacitance generated between the second coupling wiring 33b and the output wiring 33c can be reduced, so that the deterioration in the output signal characteristics of the oscillator 1 can be reduced.

In the present embodiment, the shield wiring 33g is coupled to the power supply wiring 33e, but the present disclosure is not limited thereto, and the shield wiring 33g may be coupled to the ground wiring 33d. In this case, similar to the case where the shield wiring 33g is coupled to the power supply wiring 33e, the parasitic capacitance generated between the first coupling wiring 33a and the output wiring 33c can also be reduced.

2. Second Embodiment

Next, an oscillator 1a according to a second embodiment will be described with reference to FIGS. 7 and 8. For convenience of description, FIG. 7 shows a state where the lid 18 is removed.

As compared with the oscillator 1 of the first embodiment, the oscillator 1a of the present embodiment is similar to the oscillator 1 of the first embodiment except that a through electrode 34e is provided in a second layer 11ba and a shield wiring 35g is formed at the upper surface 22 of the second layer 11ba. Differences from the first embodiment described above will be mainly described, and description of similar matters is omitted.

Figure 7:
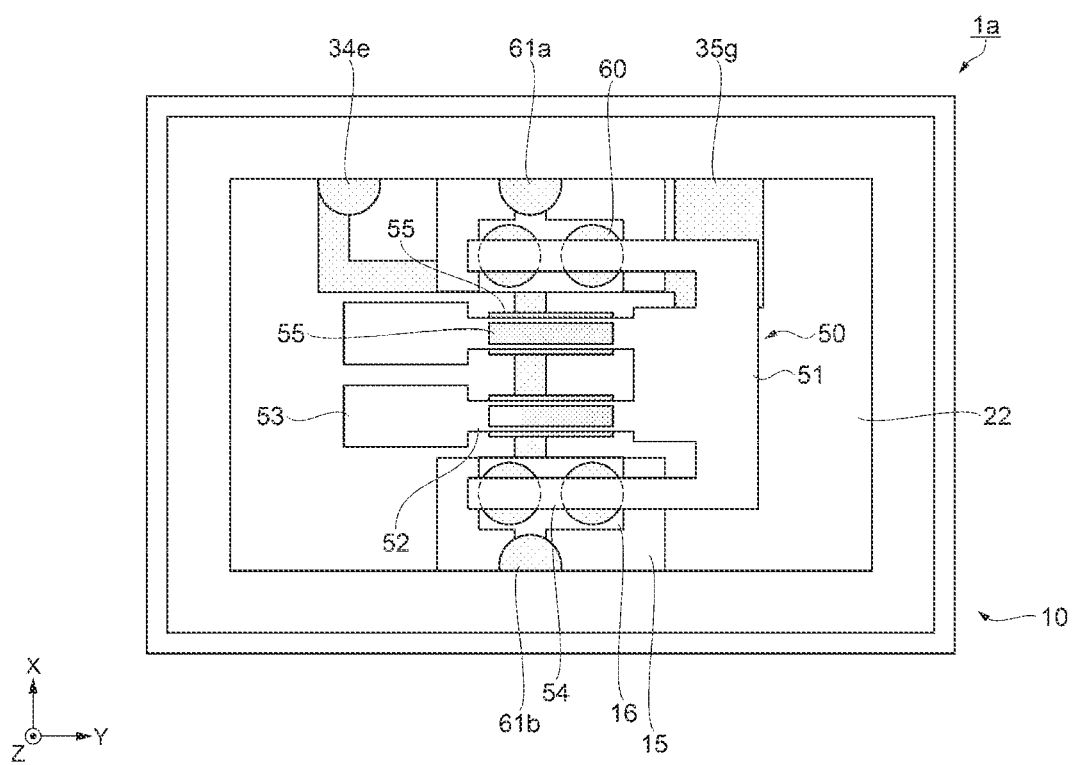
FIG. 7 is a plan view showing a schematic structure of an oscillator according to a second embodiment.
Figure 8:
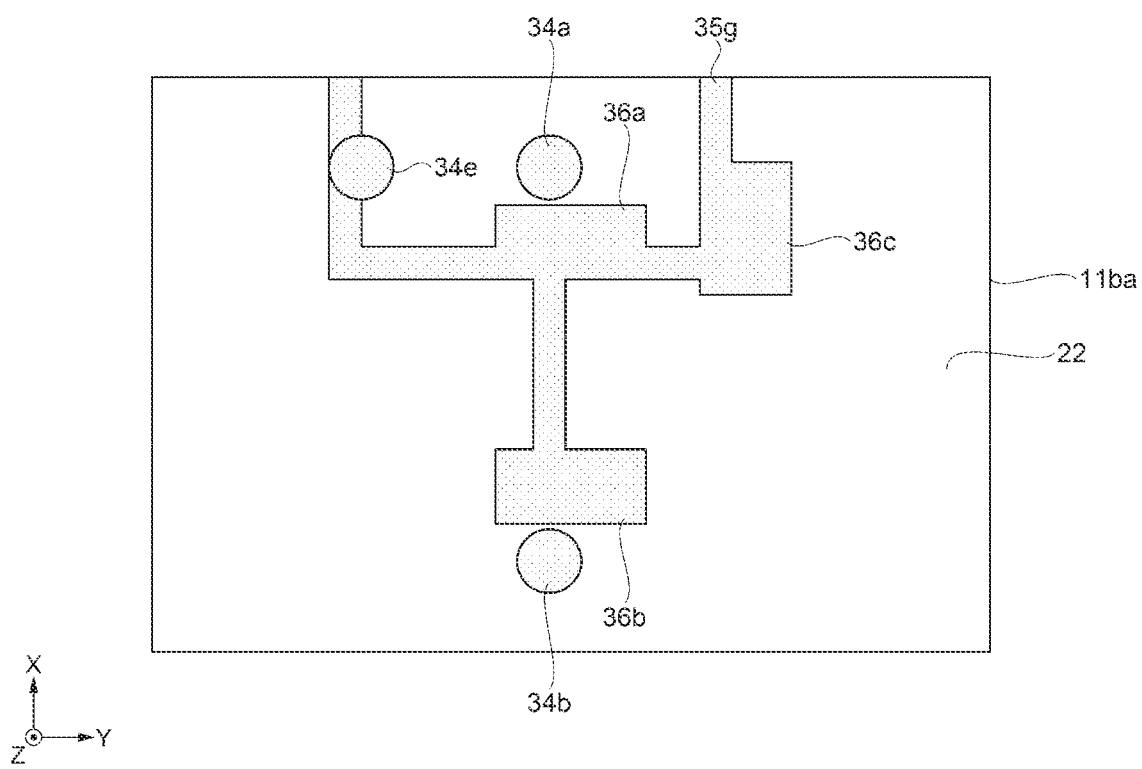
FIG. 8 is a plan view showing a wiring pattern formed at an upper surface of a second layer.

As shown in FIGS. 7 and 8, in the oscillator 1a, the through electrode 34e is provided at a position of the second layer 11ba, overlapping the through electrode 32e provided in the first layer 11a in a plan view, and is electrically coupled to the through electrode 32e of the first layer 11a. Further, the through electrode 34e is electrically coupled to the shield wiring 35g including increased-width portions 36a and 36b provided at positions overlapping the mount electrode 16 provided on the mount portion 15 in a plan view and an increased-width portion 36c provided at a position overlapping the output terminal 41c of the circuit element 40 in a plan view. Since the shield wiring 35g is provided between the mount electrode 16 and the output terminal 41c, a parasitic capacitance generated between the mount electrode 16 and the output terminal 41c can be reduced.

With such a configuration, effects similar to those of the oscillator 1 of the first embodiment can be obtained.

3. Third Embodiment

Next, an oscillator 1b according to a third embodiment will be described with reference to FIGS. 9 and 10. For convenience of description, FIG. 9 shows a state where the lid 18 is removed.

As compared with the oscillator 1 of the first embodiment, the oscillator 1b of the present embodiment is similar to the oscillator 1 of the first embodiment except that the through electrode 34e is provided in a second layer 11bb and a shield wiring 37g is formed at the upper surface 22 of the second layer 11bb. Differences from the first embodiment described above will be mainly described, and description of similar matters is omitted.

Figure 9:
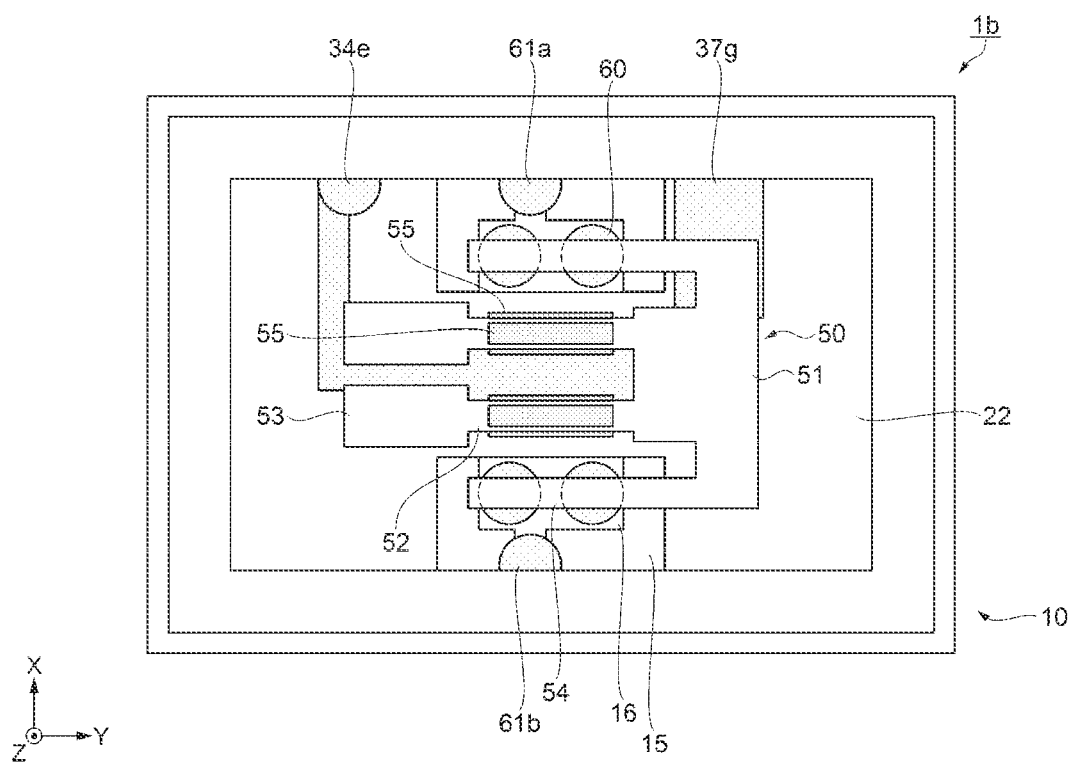
FIG. 9 is a plan view showing a schematic structure of an oscillator according to a third embodiment.
Figure 10:
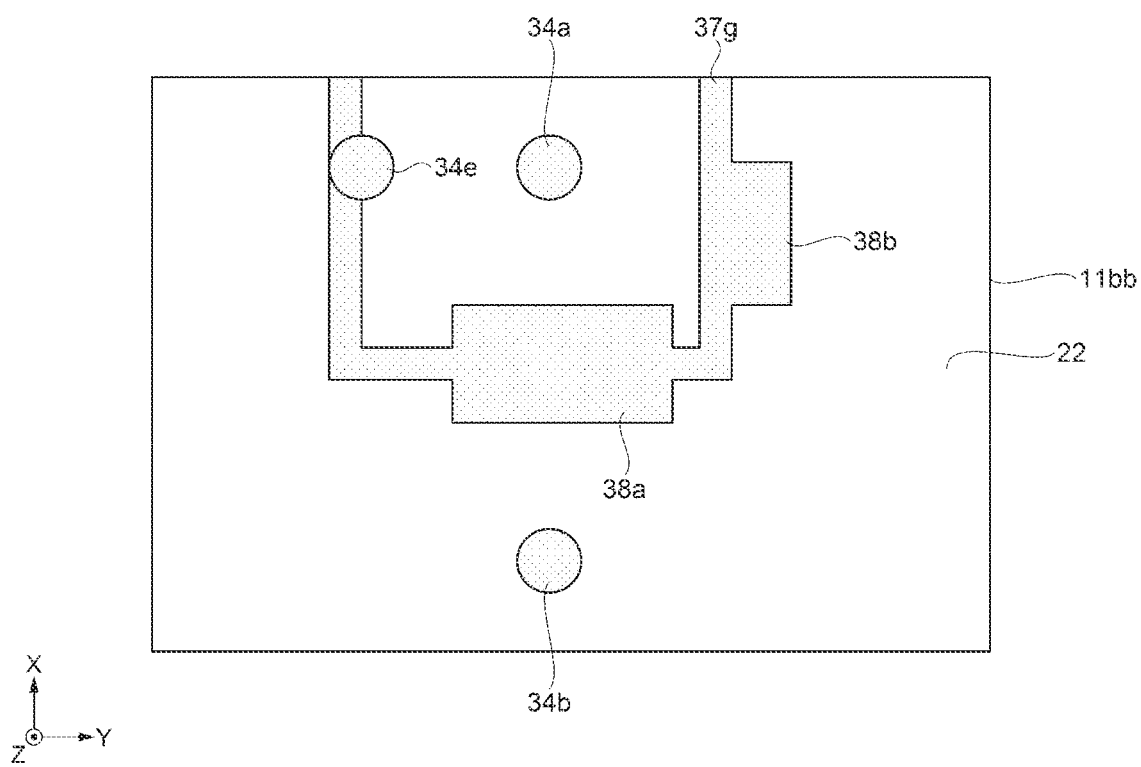
FIG. 10 is a plan view showing a wiring pattern formed at an upper surface of a second layer.

As shown in FIGS. 9 and 10, in the oscillator 1b, the through electrode 34e is provided at a position of the second layer 11bb, overlapping the through electrode 32e provided in the first layer 11a in a plan view, and is electrically coupled to the through electrode 32e of the first layer 11a. Further, the through electrode 34e is electrically coupled to the shield wiring 37g including an increased-width portion 38a provided at a position overlapping the excitation electrode 55 provided in the resonator element 50 in a plan view and an increased-width portion 38b provided at a position overlapping the output terminal 41c of the circuit element 40 in a plan view. Since the shield wiring 37g is provided between the excitation electrode 55 and the output terminal 41c, a parasitic capacitance generated between the excitation electrode 55 and the output terminal 41c can be reduced.

With such a configuration, effects similar to those of the oscillator 1 of the first embodiment can be obtained.

4. Fourth Embodiment

Next, an oscillator 1c according to a fourth embodiment will be described with reference to FIGS. 11 and 12. For convenience of description, FIG. 11 shows a state where the lid 18 is removed.

As compared with the oscillator 1 of the first embodiment, the oscillator 1c of the present embodiment is similar to the oscillator 1 of the first embodiment except that a shield wiring 39g formed at the second surface 21b of a first layer 11ac is different. Differences from the first embodiment described above will be mainly described, and description of similar matters is omitted.

Figure 11:
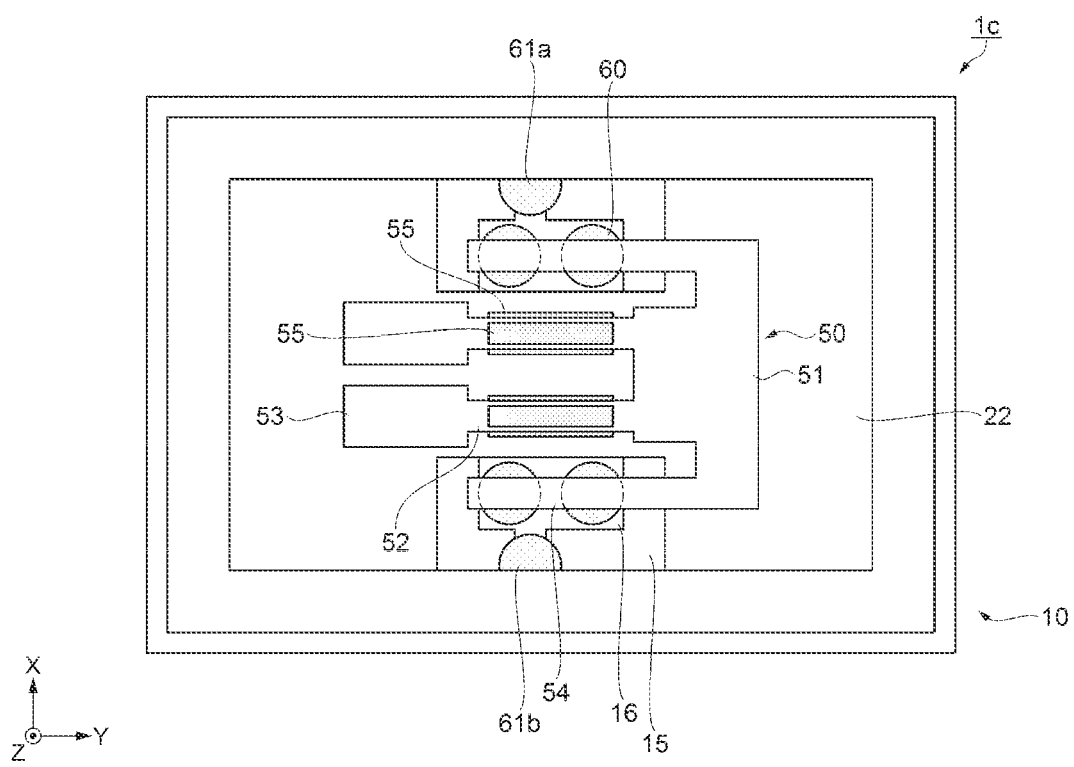
FIG. 11 is a plan view showing a schematic structure of an oscillator according to a fourth embodiment.
Figure 12:
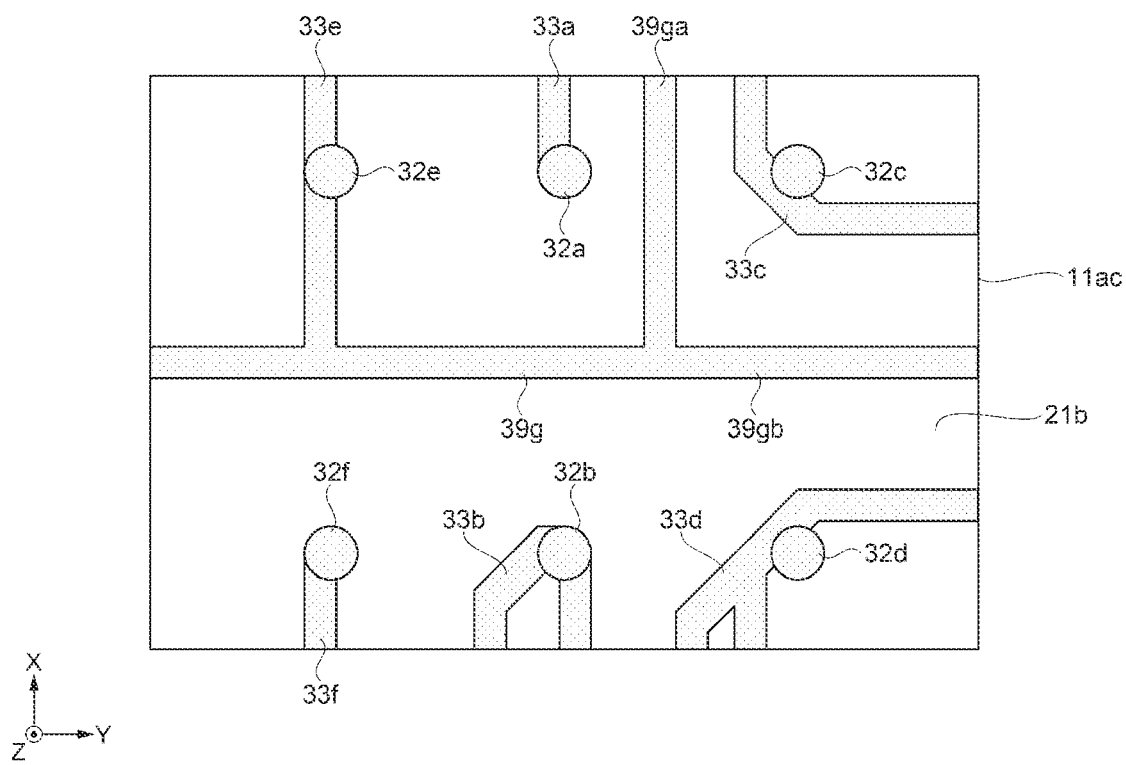
FIG. 12 is a plan view showing a wiring pattern formed at a second surface of a first layer.

As shown in FIGS. 11 and 12, the oscillator 1c is provided with the shield wiring 39g on the second surface 21b of the first layer 11ac, the shield wiring 39g including a wiring pattern 39ga that extends in the X direction between the through electrode 32c and the output wiring 33c electrically coupled to the output terminal 41c of the circuit element 40 and the through electrode 32a and the first coupling wiring 33a electrically coupled to the first coupling terminal 41a of the circuit element 40, and a wiring pattern 39gb that extends in the Y direction between the through electrode 32d and the ground wiring 33d electrically coupled to the ground terminal 41d of the circuit element 40 and the through electrode 32c and the output wiring 33c. That is, the shield wiring 39g is disposed to surround the output wiring 33c from two directions including the X direction and the Y direction. Therefore, a parasitic capacitance generated between the output wiring 33c and the second coupling wiring 33b can also be reduced.

With such a configuration, effects similar to those of the oscillator 1 of the first embodiment can be obtained.

What is claimed is:
1. An oscillator comprising:
a resonator element;
a circuit element that is coupled to the resonator element and is configured to output a clock signal; and
a container that houses the resonator element and the circuit element and includes a substrate mounted with the circuit element,
wherein the circuit element includes a plurality of terminals including
a first coupling terminal coupled to the resonator element, a second coupling terminal coupled to the resonator element and disposed side by side with the first coupling terminal in a first direction, and an output terminal that is disposed adjacent to the first coupling terminal in a second direction orthogonal to the first direction and from which the clock signal is output, wherein the substrate includes
- a first layer including a first surface mounted with the circuit element and a second surface in a front and back relationship with the first surface,
- a second layer stacked on the first layer,
- a first coupling electrode provided on the first surface and coupled to the first coupling terminal,
- a second coupling electrode provided on the first surface and coupled to the second coupling terminal,
- an output electrode provided on the first surface and coupled to the output terminal,
- a first coupling wiring provided on the second surface and coupled to the first coupling electrode,
- a second coupling wiring provided on the second surface and coupled to the second coupling electrode,
- an output wiring provided on the second surface and coupled to the output electrode, and
- a shield wiring that is provided between the first coupling wiring and the output wiring on the second surface and to which a direct-current potential is applied.

2. The oscillator according to claim 1, wherein
one side of the substrate is mounted with the resonator element, and the other side is mounted with the circuit element, the substrate includes a mount electrode coupled to the resonator element, and the shield wiring is provided between the mount electrode and the output terminal of the circuit element.

3. The oscillator according to claim 1, wherein
one side of the substrate is mounted with the resonator element, and the other side is mounted with the circuit element, and the shield wiring is provided between an excitation electrode provided in the resonator element and the output terminal of the circuit element.

4. The oscillator according to claim 1, wherein
the shield wiring is disposed between the first coupling wiring as well as the second coupling wiring and the output wiring to surround the output wiring from two directions.

5. The oscillator according to claim 1, wherein
the shield wiring is disposed between the first coupling electrode and the output electrode in a plan view.

6. The oscillator according to claim 1, wherein
the shield wiring extends between the first coupling wiring and the second coupling wiring.

7. The oscillator according to claim 1, wherein
the resonator element is a tuning fork type resonator element, and includes a support arm provided in parallel with a vibrating arm, and the support arm is coupled to the substrate at a position between both end portions of the vibrating arm in the second direction.

* * * * *